Nov. 24, 1970 R. B. CAVANAGH 3,543,123
POSITION SELECTOR CIRCUITS FOR A DRIVEN SHAFT
OR OTHER DRIVEN MEMBER
Filed Dec. 18, 1967 2 Sheets-Sheet 1

INVENTOR.
ROBERT B. CAVANAGH
BY
P. W. McBurney
PATENT AGENT

ROBERT B. CAVANAGH
INVENTOR.
BY R. W. McKenney
PATENT AGENT

United States Patent Office 3,543,123
Patented Nov. 24, 1970

3,543,123

POSITION SELECTOR CIRCUITS FOR A DRIVEN SHAFT OR OTHER DRIVEN MEMBER

Robert B. Cavanagh, New Hamburg, Ontario, Canada, assignor to Electrohome Limited, North Kitchener, Ontario, Canada Filed Dec. 18, 1967, Ser. No. 693,053
Int. Cl. G05b *11/26*
U.S. Cl. 318—467 5 Claims

ABSTRACT OF THE DISCLOSURE

The selection of a circuit changes the conductivity of the circuit from one condition to the opposite condition. If the change in conductivity is from the one condition to the opposite condition, a driver driving a member automatically is operated, but when the change in conductivity is in the opposite direction, the driver automatically is rendered inoperative. The driven member is driven to a position that is predetermined by selection of the circuit. When this position is reached, the conductivity of the circuit automatically is changed back to the one condition, and, hence, the driver automatically is rendered inoperative.

This invention is related to the invention disclosed in my copending Pat. No. 3,503,018, issued Mar. 24, 1970.

This invention relates to position selector circuits for a driven shaft or other driven member. More particularly, this invention relates to station selector circuits for signal receivers, such as radio and television receivers, and to signal receivers employing such station selector circuits.

Conventional television receivers commonly are provided with a manually operated tuner having a single control knob that is manually rotated by the user to select any desired channel. Some television receivers have tuners that are operated by stepping motors. With such a receiver a remote control unit may be provided, and the user can select any desired channel by pressing a push button on the remote control unit, thereby causing the stepping motor to operate and the tuner to advance from one channel to the next channel with each depression of the push button.

In accordance with the instant invention in one embodiment, channel selector circuits are provided which possess memory. The circuits are so designed that the tuner automatically will seek after and stop at the channel selected. In other words, assume that a television receiver provided with a channel selector circuit embodying this invention is tuned to channel 2, and that it is desired to tune the receiver to channel 9. In accordance with the instant invention, the user selects the channel of his choice by actuating a switch corresponding to that channel, in the present case, channel 9, the tuner then will seek channel 9 automatically, and the motor driving the tuner will stop automatically as soon as the tuner is tuned to channel 9.

In accordance with this invention, which is for use, in one embodiment, with a television receiver having a tuner and driving means for the tuner such that the tuner may be driven to positions coresponding to various channels, channel selector means are provided for automatically controlling the driving means to drive the tuner to selected ones of the positions. These means include means for changing the conductivity of a first circuit from one condition to and for temporarily maintaining the conductivity of that part of the first circuit in the opposite condition in response to the selection of a first channel corresponding to one of the positions of the tuner. Means are provided responsive to a change in conductivity from the one to the opposite condition for automatically causing operation of the driving means and responsive to the opposite change in conductivity for rendering the driving means inoperative. Means also are provided responsive to the tuner being driven to the aforesaid one position for automatically changing the conductivity of the first circuit back to its one condition, thereby automatically rendering the driving means inoperative.

This invention will become more apparent from the following detailed description, taken in conjunction with the appended drawings, in which FIG. 1 is a front view of a television receiver embodying this invention;

Figure 1:
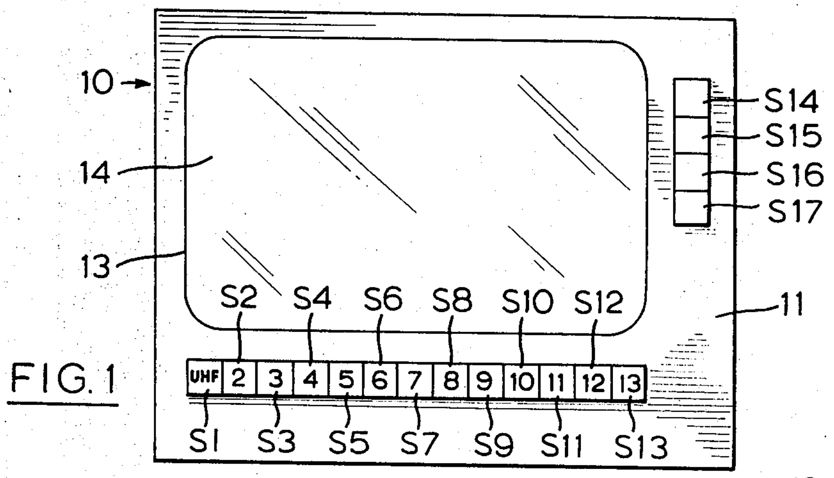

Referring to FIG. 1, there is shown a television receiver 10 having a front panel 11 with an opening 13 therein in which is located the screen 14 of the picture tube of the receiver. Disposed below opening 13 are a plurality of switches S1, S2, S3, S4, S5, S6, S7, S8, S9, S10, S11, S12 and S13. Switches S2 to S13 inclusive are employed for the selection of channels 2 to 13 respectively, while switch S1 is employed for the selection of a UHF channel. Switches S1 to S13 may be of any type. Thus, they may be mechanical switches, such as push-button type switches, or they may be electronic switches without moving parts, such as neon tube switches with capacitive effect triggering. Positioned to one side of opening 13 are additional switches S14, S15, S16 and S17 for controlling power, volume, vertical hold and fine tuning, etc.

Figure 2:
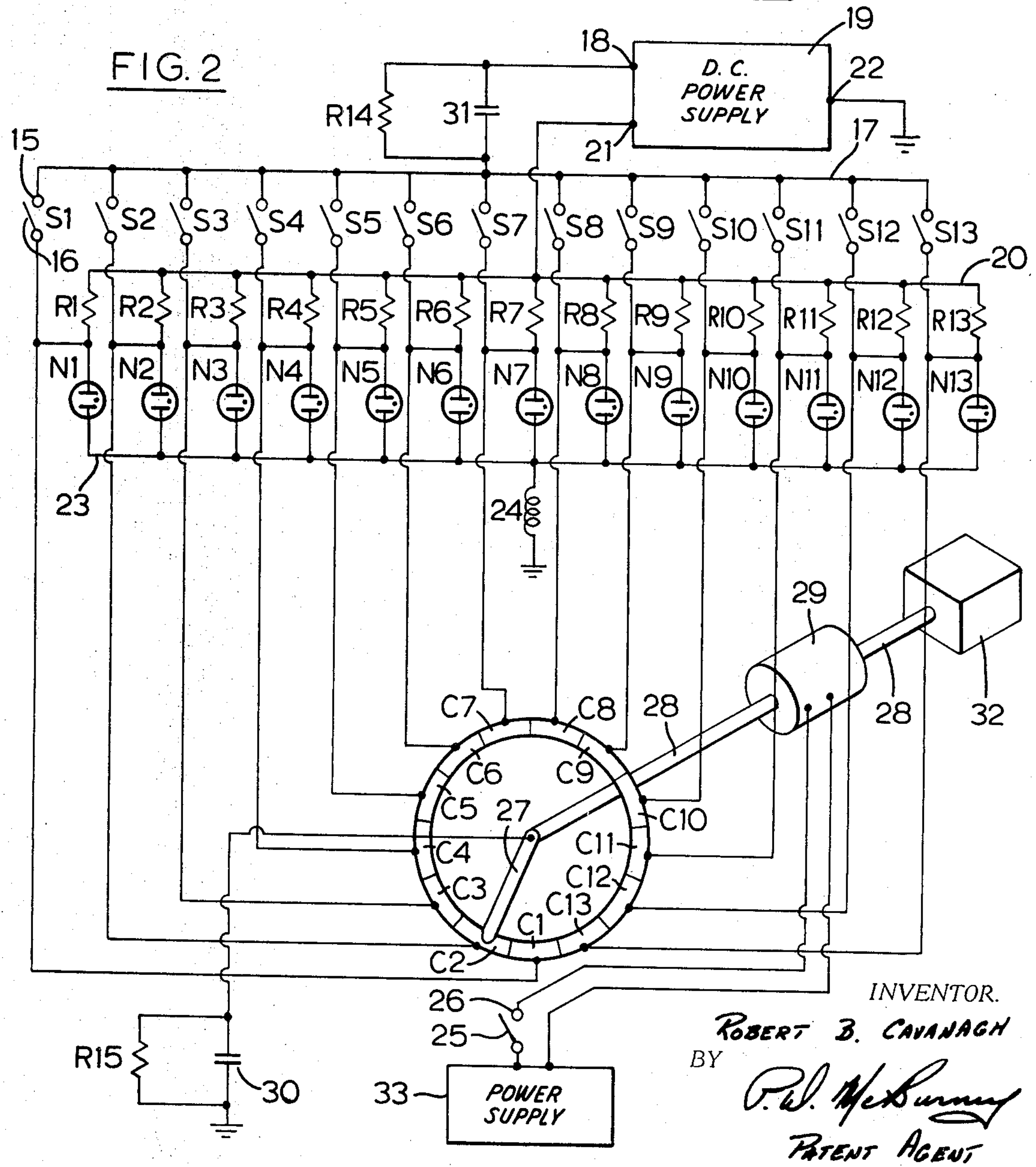
FIG. 2 is a circuit diagram of a channel selector circuit embodying this invention.

With reference now to FIG. 2, there is shown a channel selector circuit embodying this invention and including switches S1 to S13 inclusive, a corresponding number of resistors R1, R2, R3, R4, R5, R6, R7, R8, R9, R10, R11, R12 and R13 and a corresponding number of neon tubes N1, N2, N3, N4, N5, N6, N7, N8, N9, N10, N11, N12 and N13.

Each switch has a fixed contact 15 and a movable contact 16. Fixed contacts 15 are connected together by a common busbar 17, and this busbar is connected to one output terminal 18 of a D.C. power supply 19 via a resistor R14 connected in parallel with a capacitor 31. The D.C. potential at output terminal 18 must be sufficient to cause breakdown of any one of neon tubes N1 to N13 upon closure of the switch connected in circuit therewith. The voltage at output terminal 18 may be +145 volts, for example.

One terminal of each of resistors R1 to R13 is connected to a common busbar 20, this busbar being connected to another output terminal 21 of D.C. power supply 19. The D.C. potential at output terminal 21 must be insufficient to cause breakdown of any one of neon tubes N1 to N13, but, on the other hand, must be sufficient to sustain conduction through any one of the neon tubes after that neon tube has been triggered into conduction. The voltage at output terminal 21 may be +85 volts, for example. A third terminal 22 of D.C. power supply 19 is connected to ground.

The terminals of resistors R1 to R13 not connected to busbar 20 are connected to one electrode of neon tubes N1 to N13 respectively, and these electrodes of neon tubes N1 to N13 also are connected to the movable contacts 16 of switches S1 to S13 respectively. The other electrodes of neon tubes N1 to N13 are connected to a common busbar 23. The coil 24 of a relay having a movable contact 25 and a fixed contact 26 is connected between busbar 23 and ground.

A plurality of fixed contacts C1, C2, C3, C4, C5, C6, C7, C8, C9, C10, C11, C12 and C13 arranged in a circle and electrically insulated from each other are provided. These contacts C1 to C13 are connected to the movable contacts 16 of switches S1 to S13 respectively. A movable contact or wiper arm 27 is mechanically connected to the shaft 28 of a motor 29 that may be of the stepping type. Wiper arm 27 also is connected to ground via a resistor R15 connected in parallel with a capacitor 30. Shaft 28 of motor 29 also is connected to and drives the tuner 32 of a television receiver. Power is supplied to motor 29 from a power supply 33 via contacts 25 and 26 when closed.

The operation of the circuit shown in FIG. 2 now will be described. With wiper arm 27 engaging contact C2, as shown in FIG. 2, tuner 32 is on channel 2, and it will be assumed that it is desired to tune the television receiver to channel 11. This is accomplished by momentarily closing switch S11. The closure of switch S11 immediately applies a potential across neon tube N11 sufficient to trigger neon tube N11 into conduction. Current will flow from output terminal 18 via resistor R14, busbar 17, closed contacts 15 and 16 of switch S11, neon tube N11 and busbar 23 through coil 24 to ground. The energization of coil 24 will cause normally open contacts 25 and 26 to close, so that power to operate motor 29 will be supplied to the motor from power supply 33. Wiper arm 27 will be rotated by motor 29 and will engage conductively and ground contacts C3, C4, etc., in turn. Switch S11, which may be spring biased to a normally open position, is closed only momentarily and then returns to the normally open position thereof shown in FIG. 2, but conduction of neon tube N11 will be sustained after the opening of switch S11 by virtue of its connection to output terminal 21, so that after switch S11 opens, current will flow from output terminal 21 via busbar 20, current limiting resistor R11, neon tube N11 and busbar 23 through coil 24 to ground, and thus contacts 25 and 26 will be kept closed. Eventually wiper arm 27 will conductively engage and ground contact C11. When this happens, both electrodes of neon tube N11 will be connected to ground, so neon tube N11 will turn off interrupting the flow of current through relay coil 24 and causing contacts 25 and 26 to open, thereby resulting in the stopping of motor 29. Tuner 32 at this time will be tuned to channel 11, since contacts C1 to C13 correspond in both number and position to the number and position of the channels to which tuner 32 may be tuned, so that when wiper arm 27 engages, say, contact C4, tuner 32 will be tuned to the frequency allocated for channel 4. During one complete revolution of tuner 32, wiper arm 27 will engage each one of contacts C1 to C13.

In order to select another channel, say channel 7, it is only necessary to momentarily close switch S7, thereby causing conduction of neon tube N7. Motor 29 then will operate driving tuner 32 and wiper arm 27 until the latter engages contact C7, at which time neon tube N7 will be extinguished, motor 29 will stop operating, and tuner 32 will be tuned to channel 7.

Resistors R14 and R15 perform a current limiting function, while capacitors 30 and 31 preferably are employed to ensure positive and fast turn on and turn off of the various neon tubes. Thus, capacitor 31 charges from power supply 19 and then discharges through a neon tube when the switch in circuit therewith is closed, thereby ensuring positive turn on of that neon tube. Similarly, capacitor C30 charges when wiper arm 27 engages the one of contacts C1 to C13 that is connected to a conductive neon tube, thereby ensuring positive turn off of that neon tube.

Those skilled in the art will appreciate that many variations of the circuit of FIG. 2 are possible. Thus, other trigger devices such as silicon controlled rectifiers or diacs could be substituted for neon tubes N1 to N13. In general, any trigger device could be substituted for neon tubes N1 to N13. As used herein, the term trigger device is intended to mean any device that sustains conduction therethrough after breakdown at a lower voltage than the voltage across the device at breakdown.

Figure 4:
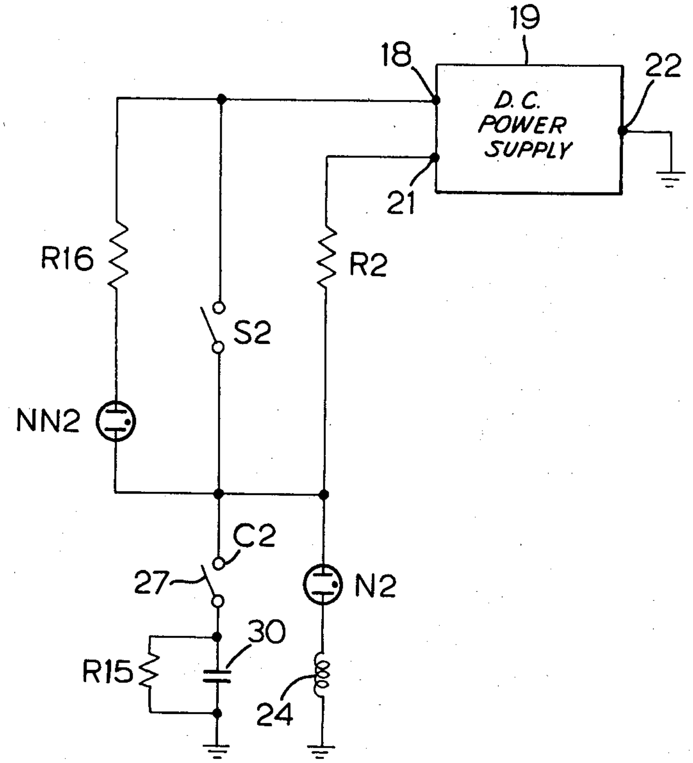
FIG. 4 shows part of yet another channel selector circuit embodying this invention.

In a preferred embodiment of this invention switches S1 to S13 are mechanical switches spring biased to return to open position and having cover plates that are transparent in part, e.g., the cover plates may be opaque with the numerals designating the channel associated with that switch being transparent. Neon tubes N1 to N13 are located behind the various cover plates of switches S1 to S13 and thus serve to provide a visual indication of the switch that has been depressed. Of course, if it is desired to maintain the illumination of this push button after the receiver has been tuned to the channel associated with this bush button, it will be necessary to provide another neon tube that remains illuminated until such time as another channel is selected, when it will be automatically extinguished. Such a modification is shown in FIG. 4, wherein, for the sake of simplicity, only one of the circuits constituted by a switch, a resistor and a neon tube has been shown. In this modification another neon tube NN2 is provided and has one of its electrodes connected via a current limiting resistor R16 to terminal 18, while the other electrode is connected to contact C2. Normally, neon tube NN2 will not be illuminated, because, even when neon tube N2 is conducting there will be insufficient voltage across neon tube NN2 to trigger it into conduction, but, when wiper arm 27 engages contact C2 extinguishing neon tube N2, a striking potential will be applied to neon tube NN2 causing illumination of the same, and current will flow from terminal 18 via resistor R16, neon tube NN2, closed contacts 27 and C2 via resistor R15 to ground. Neon tube NN2 will remain illuminated until another channel is selected and wiper arm 27 breaks contact with contact C2.

Figure 3:
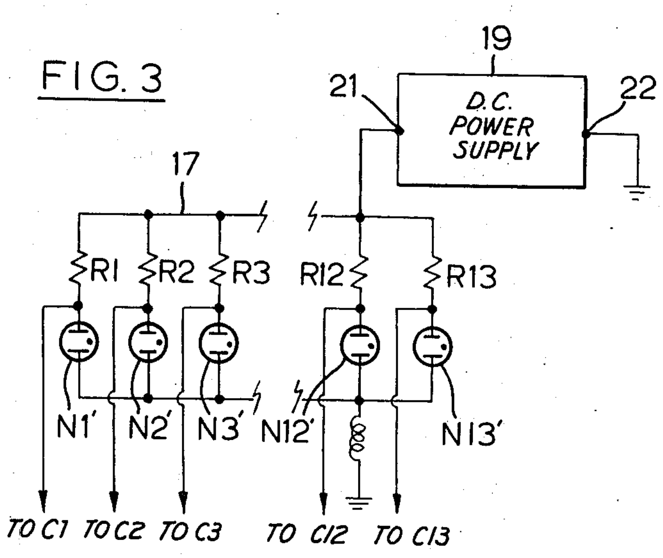
FIG. 3 shows part of another channel selector circuit embodying this invention.

Another embodiment of this invention is shown in part in FIG. 3. This embodiment differs from that of FIG. 2 in that switches S1 to S13 have been eliminated, and neon tubes N1′, N2′, N3′ . . . N12′ and N13′ have been substituted for neon tubes N1 to N13 respectively. Each neon tube N1′ to N13′ may be provided with its own conductive shield (not shown) extending around the outside of the tube. Each shield is connected via its own normally open contacts through a large resistor to a suitable D.C. power supply. When these contacts are bridged by a person's finger in response to selection of a particular channel by that person, a relatively high electrostatic field results between the anode of the neon tube in the selected circuit and its shield causing ionization of the neon gas in the tube and conduction of the neon tube. This may be referred to as capacitive effect triggering. The operation of the circuit of FIG. 3 is basically the same as the operation of the circuit of FIG. 2, except that the neon tubes of FIG. 3 are triggered into conduction simply by using one's finger to bridge the aforementioned contacts, rather than by actually closing a switch such as any of switches S1 to S3 of FIG. 2.

While the embodiments of this invention illustrated in FIGS. 1 and 2 rely upon conduction of a circuit to initiate operation of motor 29, it will be appreciated readily that the opposite could be the case without departing from this invention. Thus, a channel selector circuit embodying this invention could employ circuits that become nonconductive when selected, and this change in state of conductivity used to cause motor 29 to operate. In this event, of course, return of the circuit to conductivity caused by the engagement of wiper arm 27 with one particular one of contacts C1 to C13 would result in the stopping of motor 29.

It is in no way essential to this invention to employ a relay such as that constituted by coil 24 and contacts 25 and 26. Many other ways of starting and stopping motor 29 in response to a change in conductivity of a circuit from one condition to the opposite condition could be used. Thus, the collector and emitter electrodes of a power transistor could be connected between one terminal of motor 29 and the grounded terminal of power supply 33, and the base electrode of the transistor could be connected to neon tubes N1 to N13 to receive signals to render the transistor conductive and nonconductive in response to changes in conductivity of a selected neon tube circuit.

Furthermore, alternative means may be employed for automatically changing the state of conduction of the selected neon tube circuit in response to tuner 32 being driven to its selected position. Thus, motor 29 or tuner 32 could generate a signal in each position thereof when the tuner is on a channel, and these signals could be used to, say, close switches short circuiting the various neon tubes N1 to N13 in sequence.

While the instant invention has been described herein with reference to a television receiver, those skilled in the art will appreciate that the invention also may be applied to the tuning of a radio receiver, for example. Indeed, the invention may be applied generally to any driving and driven member where automatic selection of a predetermined position to be assumed by the driven member is a desired objective. Moreover, it is not necessary for the driven member to be one which is rotated. Thus, for example, the driven member may be one that is moved axially or laterally to different positions.

While preferred embodiments of this invention have been disclosed herein those skilled in the art will appreciate that changes and modifications may be made therein without departing from the spirit and scope of this invention as defined in the appended claims.

What I claim as my invention is:

1. In combination with a signal receiver of a type having a tuner for station selection adapted to move to a plurality of positions in each of which said tuner is tuned to a frequency allocated to a broadcasting station, and driving means for driving said tuner to said various positions, whereby said tuner may be tuned to signals of different frequencies; the improvement comprising station selector means for automatically controlling said driving means to drive said tuner to selected ones of said positions, said station selector means comprising first and second circuits, said first circuit including a first trigger device for changing the conductivity of said first circuit from one condition to the opposite condition in response to selection of said first circuit, said second circuit including a second trigger device for changing the conductivity of said second circuit from said one condition to said opposite condition in response to selection of said second circuit; means responsive to a change in conductivity of either of said circuits from said one condition to said opposite condition for automatically rendering said driving means operating and responsive to both of said circuits simultaneously being in said one condition of conductivity for rendering said driving means inoperative; means including a switch driven by said driving means responsive to said tuner being driven by said driving means to one of first and second different positions predetermined by the selected one of said first and second circuits respectively for automatically changing the conductivity of said selected one of said circuit from said opposite condition to said one condition, thereby rendering said driving means inoperative, said means responsive to said tuner being driven to said one of said first and second positions including a third circuit adapted to bypass the one of said trigger devices in said selected one of said first and second circuits upon completion of said third circuit, said switch being included in said third circuit for completing said third circuit when said tuner is in said one position, a fourth circuit adapted to bypass the other of said trigger devices upon completion of said fourth circuit, said switch being included in said fourth circuit for completing said fourth circuit when said tuner is in the other of said positions, first and second illuminable means associated with said first and second circuits respectively and both nonilluminated when said first and second circuits respectively are in said opposite condition, and means responsive to completion of said third and fourth circuits for illuminating said first and second illuminable means respectively.

2. The invention according to claim 1 wherein said trigger devices are neon tubes.

3. In combination with a signal receiver of a type having a tuner for station selection adapted to move to a plurality of positions in each of which said tuner is tuned to a frequency allocated to a broadcasting station, and driving means for driving said tuner to said various positions, whereby said tuner may be tuned to signals of different frequencies; the improvement comprising station selector means for automatically controlling said driving means to drive said tuner to a selected ones of said positions, said station selector means comprising a plurality of first circuits each including a trigger device and control means for said driving means, the number of said first circuits and the number of said trigger devices corresponding to the number of said positions, said control means being adapted to start said driving means upon conduction of any of said trigger devices, maintain said driving means in operation during conduction of any of said trigger devices and stop said driving means when all of said trigger devices are nonconductive, power supply means for supplying to any selected one of said trigger devices a potential sufficient to render said selected trigger device conductive, a second circuit for each trigger device, each second circuit being adapted to bypass a different one of said trigger devices for rendering any conductive one of said trigger devices nonconductive upon completion of said second circuit bypassing said conductive one of said trigger devices, said second circuits each including first switch means, said first switch means being connected to be driven by said driving means and completing one of said second circuits each time said tuner is operated from one of said positions to the next one of said positions, said first switch means being adapted to complete all of said second circuits during one revolution of said tuner, an illuminable device associated with each of said second circuits, and means responsive to completion of each said second circuit for illuminating said illuminable device associated with such second circuit, said illuminable devices being nonilluminated when said second circuits are uncompleted.

4. The invention according to claim 3 wherein each of said first circuits includes a second switch, the number of said second switches corresponding to the number of said positions, said second switches being adapted to apply said potential to said trigger devices when said second switches are closed.

5. The invention according to claim 4, including means for maintaining said selected one of said trigger devices conductive after momentary closing of said second switch in circuit with said selected one of said trigger devices until said second circuit bypassing said selected one of said trigger devices is completed.

References Cited

UNITED STATES PATENTS 3,104,351 9/1963 Rosenberg ---------- 318—467

THOMAS E. LYNCH, Primary Examiner